United States Patent
Peterson

(10) Patent No.: US 7,402,869 B2
(45) Date of Patent: Jul. 22, 2008

(54) APPARATUS AND METHOD FOR BREAKDOWN PROTECTION OF A SOURCE FOLLOWER CIRCUIT

(75) Inventor: Michael J. Peterson, Eagan, MN (US)

(73) Assignee: Agere Systems Inc, Allentown, PA (US)

( * ) Notice: Subject to any disclaimer, the term of this patent is extended or adjusted under 35 U.S.C. 154(b) by 313 days.

(21) Appl. No.: 10/953,898

(22) Filed: Sep. 29, 2004

(65) Prior Publication Data

US 2006/0071277 A1    Apr. 6, 2006

(51) Int. Cl.
*H01L 23/62* (2006.01)

(52) U.S. Cl. ..................... 257/360; 257/360
(58) Field of Classification Search ......... 257/360–365, 257/E27.112; 365/65; 361/55
See application file for complete search history.

(56) References Cited

U.S. PATENT DOCUMENTS

| 5,469,085 A | | 11/1995 | Shibata et al. |
| 6,057,998 A | * | 5/2000 | Sakamoto et al. ............. 361/78 |
| RE37,593 E | * | 3/2002 | Etoh et al. .................. 365/205 |
| 6,697,241 B1 | * | 2/2004 | Smith ....................... 361/91.1 |

OTHER PUBLICATIONS

Annema, et al; "5.5-V I/O in a 2.5-V 0.25-μm CMOS Technology"; IEEI Journal of Solid-State Circuits, vol. 6, No. 5, Mar. 2001; pp. 528-538.

* cited by examiner

*Primary Examiner*—Nathan W Ha

(57) ABSTRACT

A breakdown protection circuit for a source follower comprising a field effect transistor (FET). The protection circuit comprises a plurality of PFET's and NFET's that are controlled to exhibit on and off states for advantageously configuring a gate, source, drain and body of the source follower FET, to avoid breakdown of and forward biasing of certain FET junctions.

23 Claims, 7 Drawing Sheets

US 7,402,869 B2

APPARATUS AND METHOD FOR BREAKDOWN PROTECTION OF A SOURCE FOLLOWER CIRCUIT

FIELD OF THE INVENTION

The present invention relates generally to a semiconductor field effect transistor configured for operation as a source follower, and more particularly, to a method and apparatus for protecting the source follower transistor from breakdown under certain operating conditions.

BACKGROUND OF THE INVENTION

Integrated circuits (chips) comprise active transistors and passive components. The chips are designed and fabricated according to conventional design parameters and semiconductor process technologies that determine operating parameters and limits for the constituent transistors. Operating power is supplied to each transistor from one or more external power supplies such that each transistor is responsive to a specified power supply voltage that is below a maximum supply voltage limit for the transistor. To accommodate different transistor designs and their associated operating limits, the chip provides multiple power supply voltages, with each transistor connected to the appropriate supply voltage for safe and reliable operation.

As is known, a transistor comprises at least two pn junctions through which current flows to achieve transistor action. A MOSFET (metal-oxide semiconductor field effect transistor) comprises doped source and drain regions formed in a well of the opposite doping type. A region of the well between the source and drain is referred to as a channel. A conductive gate overlies the channel and is separated therefrom by a dielectric layer. Application of a voltage to the gate inverts the conductivity of the channel permitting current to flow between the source and the drain.

The equation for current flow for both an n-channel (NMOS) and a p-channel (PMOS) MOSFET is:

$$I = K(W/L)(Vgs-Vt)(Vgs-Vt),$$

where: K is a constant for a given technology, Vgs is the voltage between the gate and the source, Vt is the threshold voltage (the Vgs at which current starts to flow through the channel) and W/L is a width/length ratio of the MOSFET structure. The quantity (Vgs−Vt) is commonly known as Veff.

Application of an excessive voltage to a pn junction (such as the source/well of a MOSFET) can cause the junction to fail or break down, possibly resulting in transistor failure. Thus a maximum junction breakdown voltage is an important MOSFET operating limit.

Transistors designed to operate with different supply voltages may exhibit different breakdown limits, as there is a direct relationship between the transistor's nominal supply voltage and its junction breakdown characteristics. Transistors designed for operation at higher supply voltages generally exhibit higher breakdown voltages. Transistors can be operated near the maximum permitted supply voltage to increase operational speed in the case of a digital circuit and to provide maximum voltage headroom in an analog circuit.

Supplying a MOSFET with a voltage in excess of a breakdown voltage can shorten the transistor's life and cause performance limiting effects, all apparently related to an excessive electric field intensity within the transistor. The electric fields of interest include vertical and lateral fields within the transistor structure and fields across transistor junctions.

Three known deleterious effects associated with high intensity electric fields are described below.

An excessive electric field across the gate dielectric causes current flow through the dielectric, possibly leading to dielectric breakdown. Also, in the case of a reverse biased pn junction, when the electric field across the junction is sufficient to cause either Zener or avalanche junction breakdown, excessive reverse current will flow, possibly leading to the generation of excess heat in the transistors or components with which it operates.

A MOSFET having a relatively high source-drain voltage creates a relatively large electric field intensity that accelerates the carriers through the channel from source to drain. If such a field is present while the MOSFET is operating in saturation (i.e., a high current flow from source to drain) the carriers may attain a sufficiently high energy such that upon collision with the channel silicon lattice atoms a fraction of the carriers are deflected into the gate dielectric (e.g., silicon dioxide). These high-energy carriers, referred to as "hot" carriers, degrade the quality of the gate dielectric, leading to premature failure of the transistor.

Continued operation of a transistor that is subject to one or more of these breakdown conditions will likely shorten the transistor's life and alter its performance over time.

Generally, there are three known approaches for overcoming the effects of an excessive electric field intensity within a MOSFET. One solution fabricates multiple MOSFET's on the chip, with each MOSFET having a different gate oxide thickness. Selection of the operative MOSFET for a specific circuit is based on the gate oxide thickness required to withstand the effects of the electric field generated by the circuit. While this technique provides a MOSFET capable of withstanding breakdown effects, fabrication process costs are increased by the extra masks and extra processing steps required, and an area penalty is incurred due to the increased chip area required to fabricate the multiple MOSFETS.

An extended-drain MOSFET includes an integrated resistor in series with the MOSFET drain. When a high current flows from the drain to the source, the voltage drop across the integrated resistor reduces the voltage at the drain and thus the magnitude of the source-drain electric field intensity. Generally, the simultaneous occurrence of a high source-drain voltage and a high drain current occurs only under transient operations. Thus, the only significant detrimental effect of the drain resistor is a slight reduction in response time, but the extended-drain MOSFET introduces an area penalty due to the area required by the integrated resistor.

A third solution uses a controllable protection circuit that prevents the application of excessive voltages to the MOSFET terminals. Within the protection circuit, voltages across transistor terminals are limited to values below breakdown.

A transistor's output voltage is related to its supply voltage, i.e., a first transistor operating at a first supply voltage provides a higher output voltage than a second transistor operating at a second supply voltage lower than the first supply voltage. In a circuit configuration where the first transistor output is supplied as an input to the second transistor, care must be exercised to ensure that the input does not exceed a breakdown voltage of the second transistor. For example, in a circuit where a signal is communicated between a first chip operating at 3.3 V and a second chip operating at 2.5 V, an input interface that can tolerate a 3.3 V input signal is disposed between the two chips to reduce the input voltage seen by the second chip, thereby limiting the breakdown effects on transistors and other components within the second chip.

One circuit configuration in which multiple transistors share a common output terminal is referred to as a "net." In the net, multiple output drivers (i.e., transistors) drive (i.e., supply an input signal) to a network of components. At a given time, one of the output drivers drives the net while the others are in an off condition. Since all output drivers may not operate at the same power supply voltage, under certain operating conditions one or more of the off-state output drivers may be exposed to an excessive voltage, which can develop an excessive electric field in the transistor and possibly cause junction breakdown.

BRIEF SUMMARY OF THE INVENTION

The present invention comprises a breakdown protection circuit for a field effect transistor comprising a gate responsive to an input signal supplied to an input terminal, a first source/drain responsive to a power supply voltage, a second source/drain for connecting to an output terminal and a body. The protection circuit further comprises a first switching element for selectably connecting the gate to the input terminal or to the body; and a second switching element for selectably connecting the body to the power supply or to the output terminal.

The present invention further comprises a method for isolating a source follower output terminal from a voltage impressed on the output terminal by a circuit external to the source follower, wherein the source follower comprises a gate responsive to an input signal, a first source/drain responsive to a power supply voltage, a second source/drain for connecting to an output terminal and a body. The method comprises connecting the gate to the input signal and the body to the output terminal for operating in a source follower mode, and in response to a relation between the power supply voltage and the voltage impressed on the output terminal, isolating the body from the output terminal.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

Before describing in detail the particular method and apparatus for providing breakdown protection for a source follower circuit, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe other elements and steps pertinent to understanding the invention in greater detail.

Figure 1:
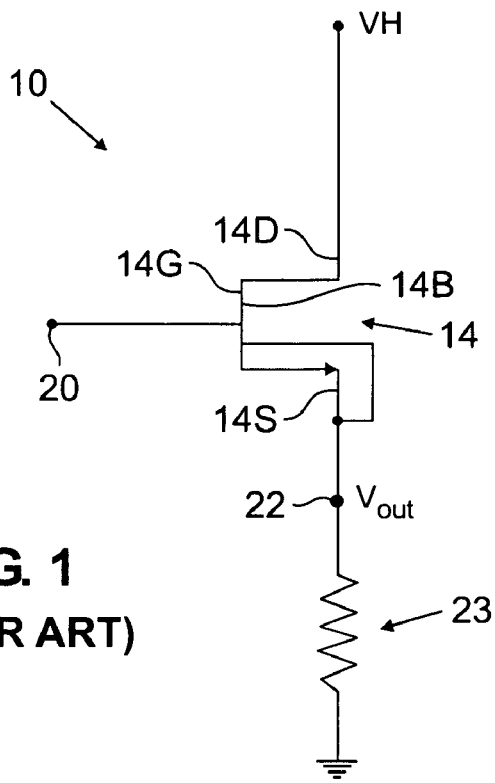
FIGS. 1 and 2 are schematic illustrations of an NMOSFET and a PMOSFET, respectively, connected in a source follower configuration.

FIG. 1 illustrates a source follower 10 comprising an NFET (NMOSFET) 14 further comprising a body or well 14B shorted to a source 14S. It is known common practice to connect an NFET body (a p-well region) to the source. A drain 14D is connected to a power supply VH.

The source follower 10 receives an input signal at an input terminal 20 connected to a gate 14G of the NFET 14. An output terminal 22 is connected to ground through a resistor 23. The source follower circuit 10 reproduces the input signal at the output terminal 22 with a voltage offset of about (Vth+Veff) (typically about 0.8 volts) and a gain of slightly less than unity. The source follower configuration is known to exhibit a relatively high input impedance and a relatively low output impedance.

The source follower circuit is placed in an off state (i.e., turned off) by grounding the input terminal 20, which grounds the gate 14G.

Figure 2:
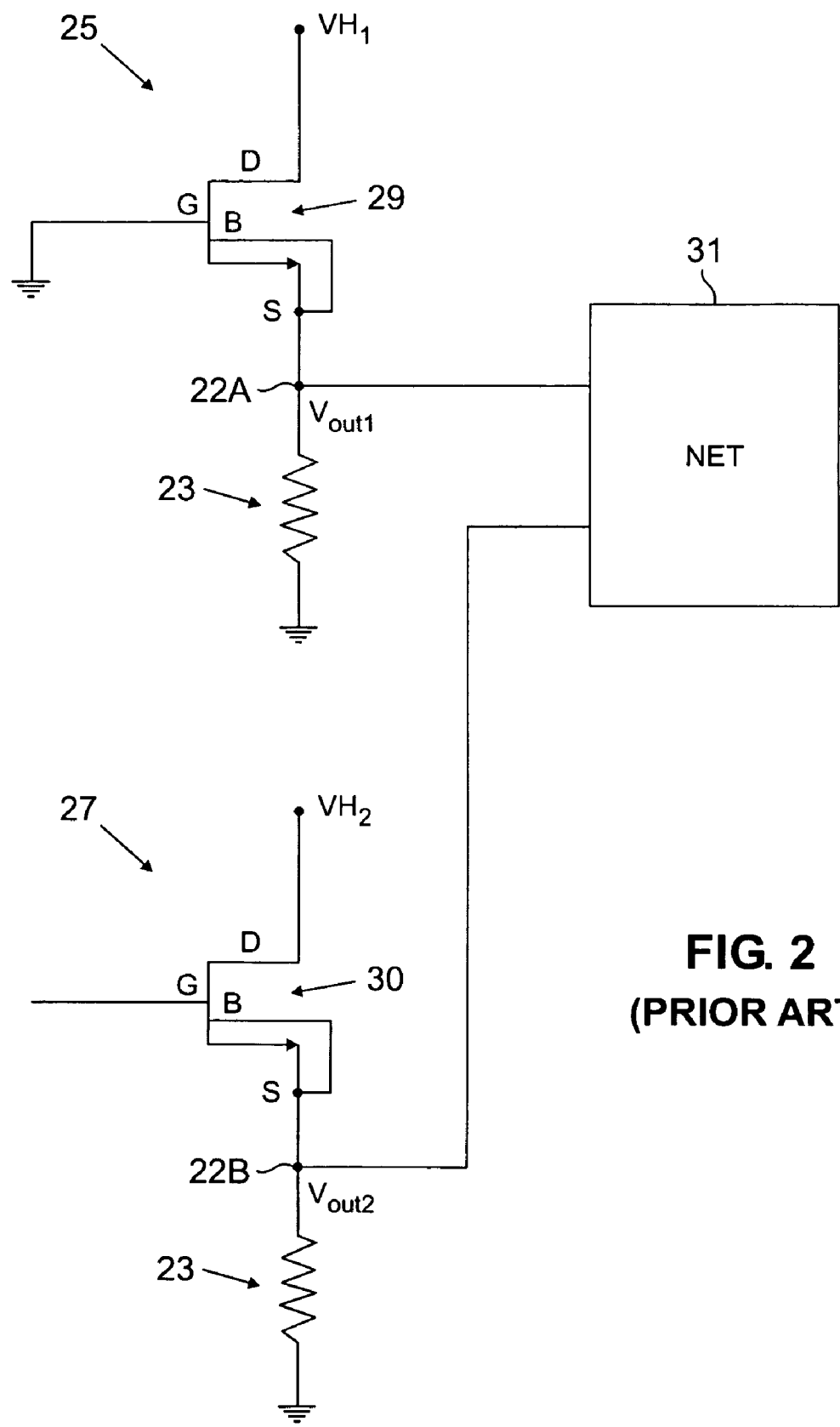

When a first and a second source follower circuit are connected to drive a net from their respective output terminals, an output terminal of the first source follower (such as the output terminal 22) is connected to an output terminal of the second source follower through the net circuit. See FIG. 2, for example, where source followers 25 and 27 (comprising MOSFETS 29 and 30) drive a net 31 from respective output terminals $V_{out1}$, and $V_{out2}$. Within the net 31, the output terminals $V_{out1}$ and $V_{out2}$ are connected together so that one or the other of the source followers 25 and 27 can provide drive signals for the net 31.

The MOSFETS 29 and 30 are responsive to power supply voltages $VH_1$ and $VH_2$, respectively, where $VH_1 < VH_2$. When the source follower 27 is in an on state, the voltage at an output terminal 22B is $V_{out2} = VH_2$. If the source follower 25 is concurrently in an off state (by grounding the gate terminal G of the MOSFET 29), the source follower 27 pulls an output terminal 22A of the MOSFET 29 to a voltage $V_{out1} = VH_2$ (due to the common connection within the net 31), which is higher than the voltage $VH_1$.

When the output terminal 22A rises above the power supply voltage $VH_1$, the normally reverse biased pn junction between the body B (a p-type region) of the MOSFET 29 and the drain D (an n-type region) can become forward biased, causing current flow from the output terminal 22B (at the voltage $VH_2$), through the forward biased body/drain junction of the MOSFET 29 into the power supply $VH_1$.

Since the MOSFET 29 is designed to operate with a power supply voltage $VH_1$, the MOSFET 29 can be damaged by driving the output terminal 22A above the power supply voltage $VH_1$. As the output terminal 22A is pulled above $VH_1$ to $VH_2$, the voltage between the gate G (which is grounded since the MOSFET 29 is off) and the source S/output terminal 22A may exceed the breakdown voltage of the gate dielectric.

The same potentially damaging situation arises if the source follower 25 and a tristate driver are connected to drive the net 31, i.e., the output terminal 22A is connected to an output terminal of a tristate push-pull driver (not shown in FIG. 1), with the tristate driver operating from a power supply voltage $VH_3$ greater than $VH_1$.

Figure 3:
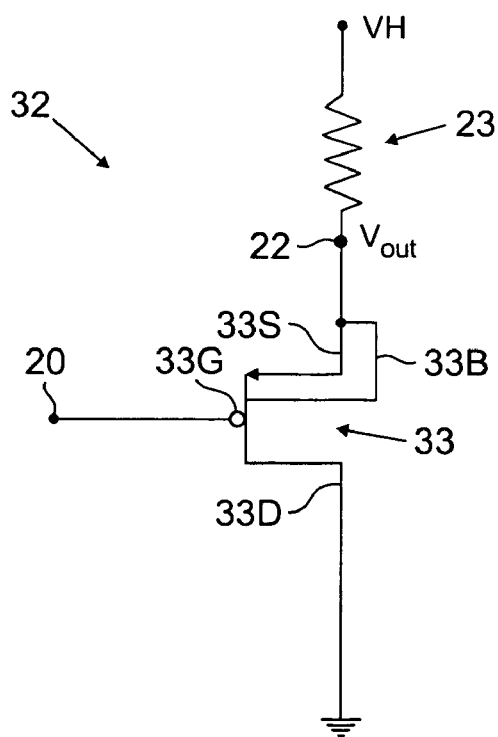
FIG. 3 illustrates prior art source followers for driving a net.

FIG. 3 illustrates a PFET 33 configured as a source follower 32. A source 33S is connected to the power supply via the resistor 23 and to a body 33B. It is common practice to connect the PFET body (an n-well region) to the highest available voltage. When driving a net such as the net 31, the PFET source follower 32 is subject to the same potentially damaging conditions as the NFET source followers 25 and 27 described above.

As is known in the art, a source follower can also be constructed using a junction field effect transistor (JFET) or a bipolar junction transistor, and thus the teachings of the present invention can be extended to such source follower implementations.

Figure 4:
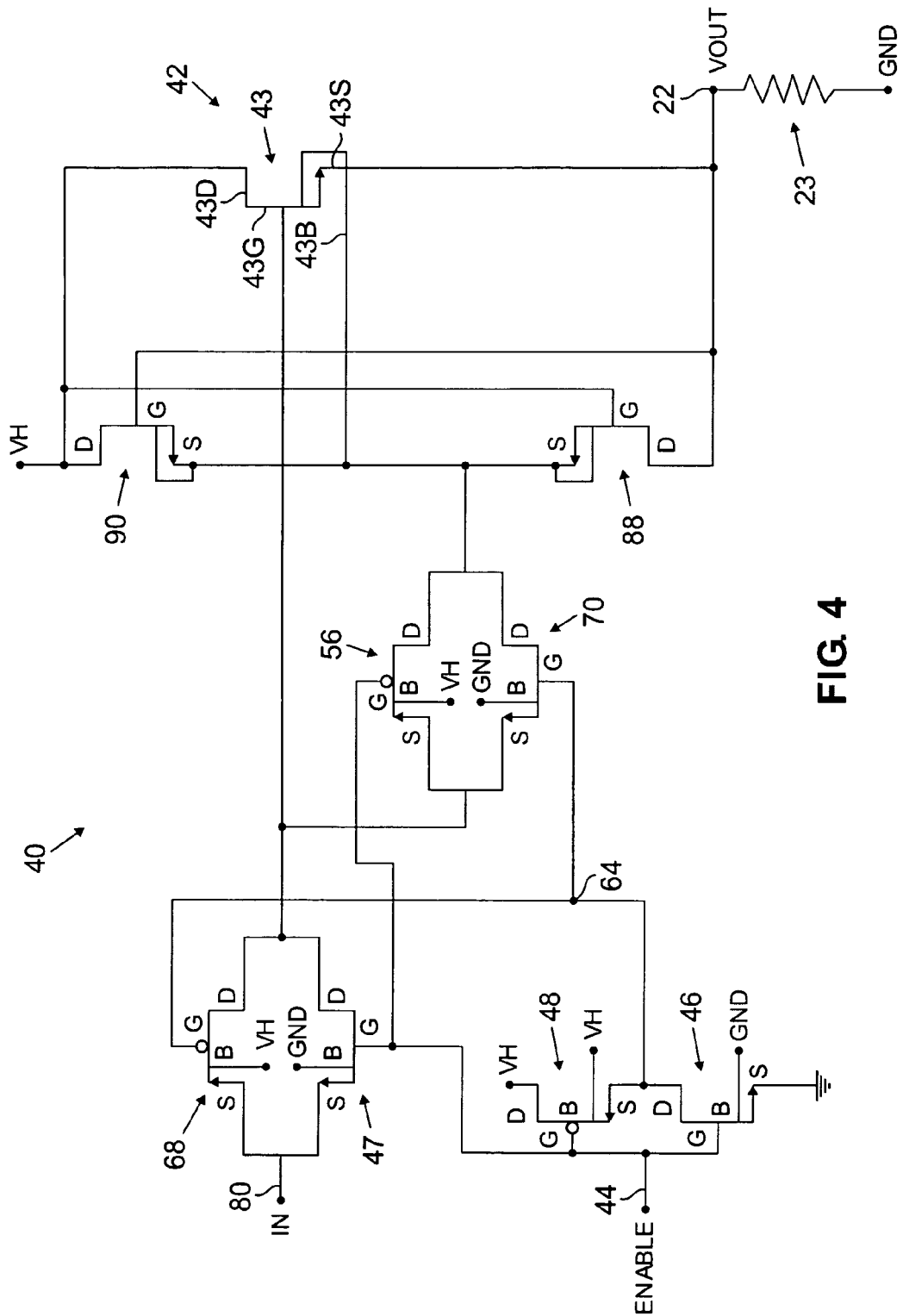
FIG. 4 is a schematic illustration of a source follower breakdown protection circuit according to the teachings of the present invention.

FIG. 4 illustrates a source follower breakdown protection circuit 40 according to the teachings of the present invention for overcoming certain potentially damaging operating conditions, including those described above for the source followers 25 and 27 in FIG. 2. The breakdown protection circuit 40 operates in one of three modes to control a source follower 42 by controlling connections to a gate 43G, a well 43B, a source 43S and drain 43D of an NFET 43 operating as the source follower 42. The three operational modes comprise: an on state for the source follower, a first off state for the source follower when the voltage at the output terminal 22 is less than the power supply voltage VH, and a second off state when the voltage at the output terminal 22 is greater than the power supply voltage VH.

Table 1 below sets forth a state of the NFETS and PFETS of the source follower breakdown protection circuit 40 for each of the three operational modes.

Since the PFET 68 and the NFET 47 are on, an input terminal 80 drives the gate 43G, as required for normal on-mode operation of the source follower 42. The source follower 42 responds to input signals applied at the gate 43G as does the conventional source follower 10 illustrated in FIG. 1. As with a conventional source follower, if the input signal drives the gate 43G to a voltage that is more than Vt above VH, the source follower output will not be able to follow the input signal.

A gate G of an NFET 88 is connected to the power supply voltage VH, turning on the NFET 88, shorting the p-well 43B to the output terminal 22 via the conducting source/drain (S/D) circuit of the NFET 88. Referring to FIG. 1, for an operational source follower the body 14B of the MOSFET 14 is connected to the output terminal 22. Thus the p-well 43B is properly configured for source follower operation.

Because a gate G of an NFET 90 is tied to the output terminal 22, the NFET 90 is off, isolating the p-well 43B from the power supply VH, as required for proper operation of the source follower 42.

Figure 5:
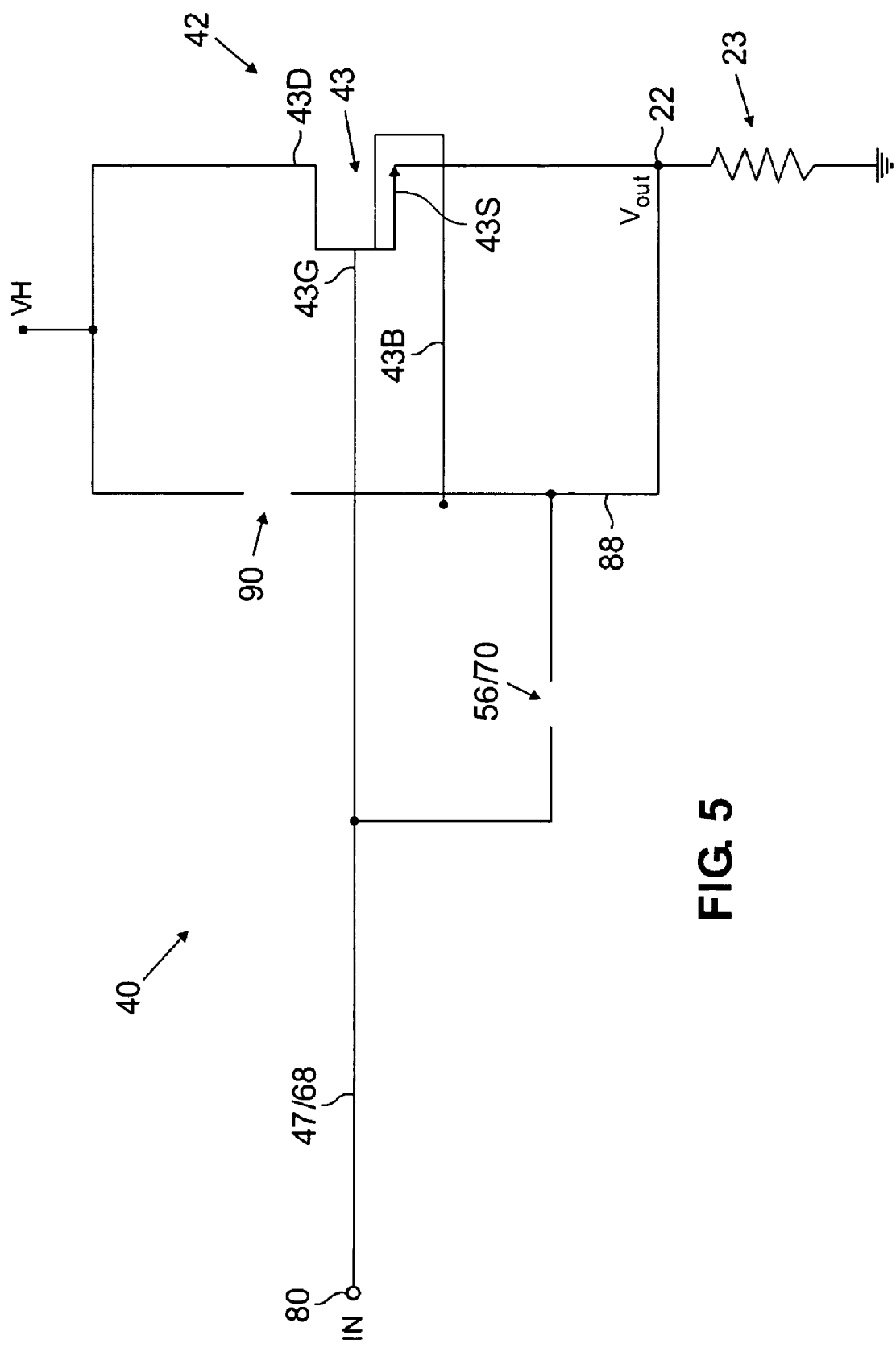
FIGS. 5, 6 and 7 are schematic illustrations of operational modes of the source follower breakdown protection circuit of FIG. 4.

FIG. 5 is a schematic illustration of certain components of the breakdown protection circuit 40 when the source follower 42 is in the on mode, i.e., the source follower operates conventionally. In FIG. 5 the on FETs 47, 68 and 88 are represented as short circuits and the off FETs 56, 70 and 90 are

TABLE 1

| | STATE | | | | | | | |
|---|---|---|---|---|---|---|---|---|
| | NFET46 | NFET47 | PFET48 | PFET68 | PFET56 | NFET70 | NFET88 | PFET90 |
| Source follower 40 is on (FIG. 5) | ON | ON | OFF | ON | OFF | OFF | ON | OFF |
| Source follower 40 is off and output terminal 22 < VH (FIG. 6) | OFF | OFF | ON | OFF | ON | ON | ON | OFF |
| Source follower 40 is off and output terminal 22 > VH (FIG. 7) | OFF | OFF | ON | OFF | ON | ON | OFF | ON |

Operation of the source follower breakdown protection circuit 40 in the source follower on state will be described first. For proper on-mode operation, the breakdown protection circuit 40 configures the drain 43D, the gate 43G, the p-well 43B and the source 43S of the NFET 43 to function as a conventional source follower, such as the source follower 10 of FIG. 1. Configuration of these regions is controlled by the state of NFETS 46, 47, 70, 88 and 90 and PFETS 48, 56 and 68 as described below.

To turn on the source follower 42 according to the first operational mode, an enable terminal 44 is set to a high state by an externally supplied signal, turning on the NFETS 46 and 47 in response to the high voltage on the gates thereof, and turning off the PFETS 48 and 56 in response to a high voltage on the gates thereof A node 64 is grounded through the source/drain path of the on NFET 46, turning on the PFET 68 by grounding a gate thereof The grounded node 64 also turns off the NFET 70 by grounding a gate thereof.

With the PFET 56 and the NFET 70 both off (i.e., exhibiting an open source/drain current path) the source follower 42 is on, as set forth in Table 1 above, and the connection between the p-well 43B and the gate 43G is open, as required for normal source follower operation.

represented as open circuits. The configuration of FIG. 5 is operationally identical to the conventional source follower 10 illustrated in FIG. 1, i.e., the p-well 43B is connected to $V_{out}$ and the input signal is supplied to the gate 43G.

To turn the source follower 42 off, the enable input 44 is driven low by an externally-supplied signal turning off the NFETs 46 and 47 and turning on the PFETs 48 and 56. Since the NFET 46 is off and the PFET 48 is on, the node 64 is high, which turns off the PFET 68 and turns on the NFET 70. See Table 1 above.

With the NFET 47 and the PFET 68 both off, the connection between the input terminal 80 and the gate 43G is open. Also, since the PFET 56 and the NFET 70 are on, the gate 43G is shorted to the p-well 43B via the source/drain current path of the PFET 56 and the NFET 70, turning off the MOSFET 43 and thus the source follower 42.

As described above, the relationship among VH, Vt and $V_{out}$ controls the two off modes of the source follower. In a first off mode the source follower is in an off state in response to the voltage at the output terminal 22 less than (VH−Vt). In a second off mode the source follower is off in response to the voltage at the output terminal 22 greater than the (VH+Vt). In an intermediate mode the output voltage $V_{out}$ is between (VH−Vt) and (VH+Vt).

In the first off mode, ($V_{out}$<VH−Vt) a threshold condition for the NFET 88 is satisfied and the NFET 88 is turned on, shorting the p-well 43B to the output terminal 22. Since the gate 43G is shorted to the p-well 43B as described above, the gate 43G, the p-well 43B and the source 43S are shorted to the output terminal 22.

With the gate G of the NFET 90 tied to the output terminal 22 and the output voltage $V_{out}$<VH−Vt, the NFET 90 is turned off, isolating the p-well 33B from the power supply VH.

As described above with respect to the prior art, forward biasing of the pn junction between the body and the drain of a source follower is to be avoided to prevent current flow from the output terminal into the source follower power supply. With regard to the present invention, in the first off state condition ($V_{out}$<VH+Vt or $V_{out}$−Vt<VH), the pn junction between the drain 43D (the n-type region connected to the power supply VH) and the p-well 43B (the p-type region connected to the output terminal 22 with a voltage $V_{out}$−Vt) cannot be forward biased since the p-type region is at a lower voltage ($V_{out}$−Vt) than the n-type region (VH).

Figure 6:
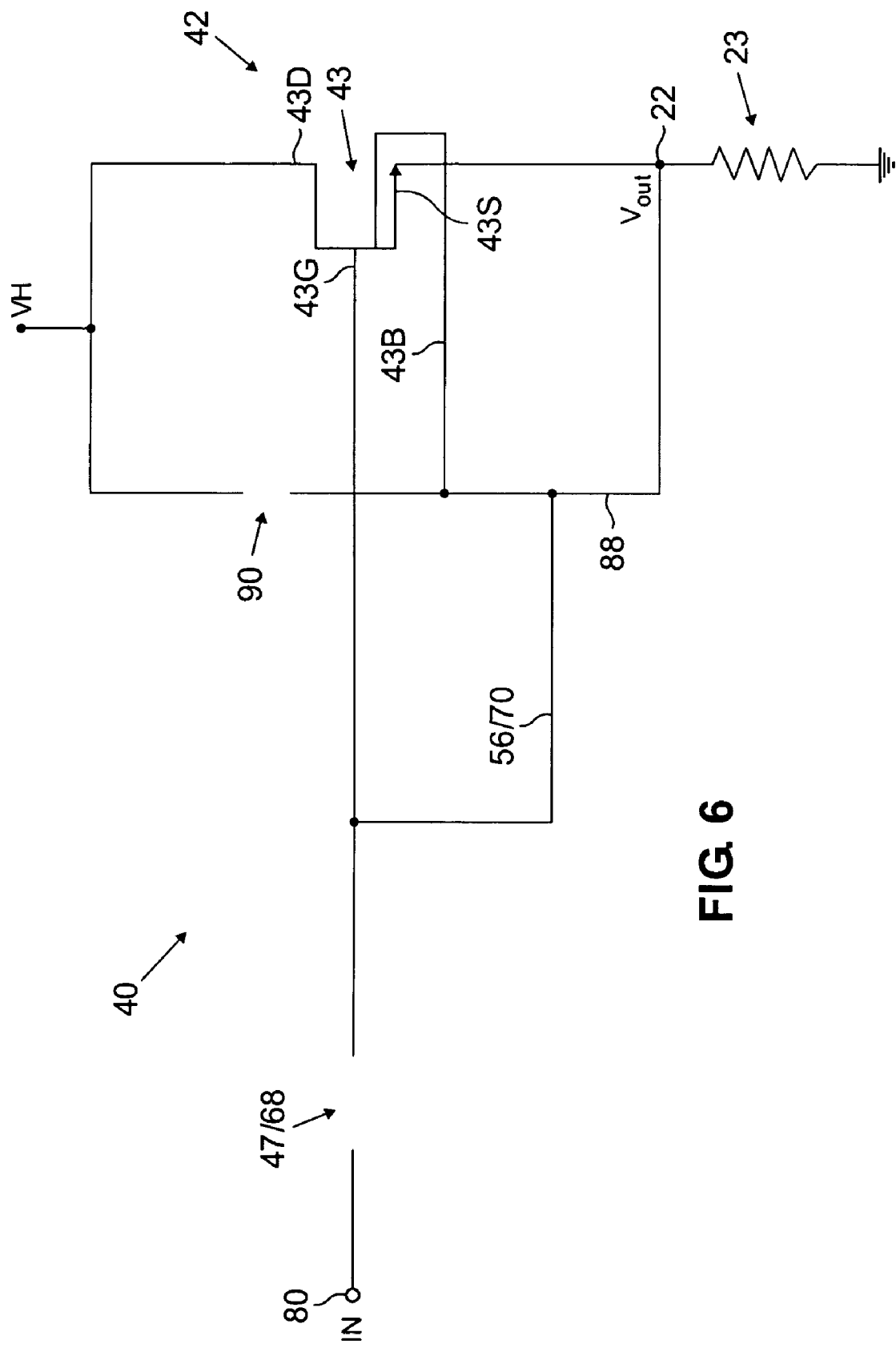

FIG. 6 is a schematic illustration of certain components of the breakdown protection circuit 40, when the source follower is in the first off mode. FIG. 6 represents the on NFETS 70 and 88 and the on PFET 56 with short circuits. The gate 43G is connected to the body or p-well 43B through the source/drain path of the PFET/NFET 56/70. The p-well 43B is connected to the source 43S and to the output terminal 22 through the source/drain of the NFET 88. The NFET/PFET 47/68 depicted as open circuits, disconnect the gate 43G from the input terminal 80.

The second off state condition occurs when $V_{out}$ is greater than (VH+Vt). Under these conditions the MOSFET 90 turns on and the MOSFET 88 turns off, shorting the p-well 43B to the power supply voltage VH. The off state of the NFET 88 isolates the p-well 43B from the output terminal 22. Since the gate 43G remains connected to the p-well 43B through the on transistors, PFET/NFET 56/70, the MOSFET 43 (and the source follower 42) remains off. An input signal applied to the input terminal 80 cannot reach the gate 43G due to the open NFET/PFET 47/68.

Figure 7:
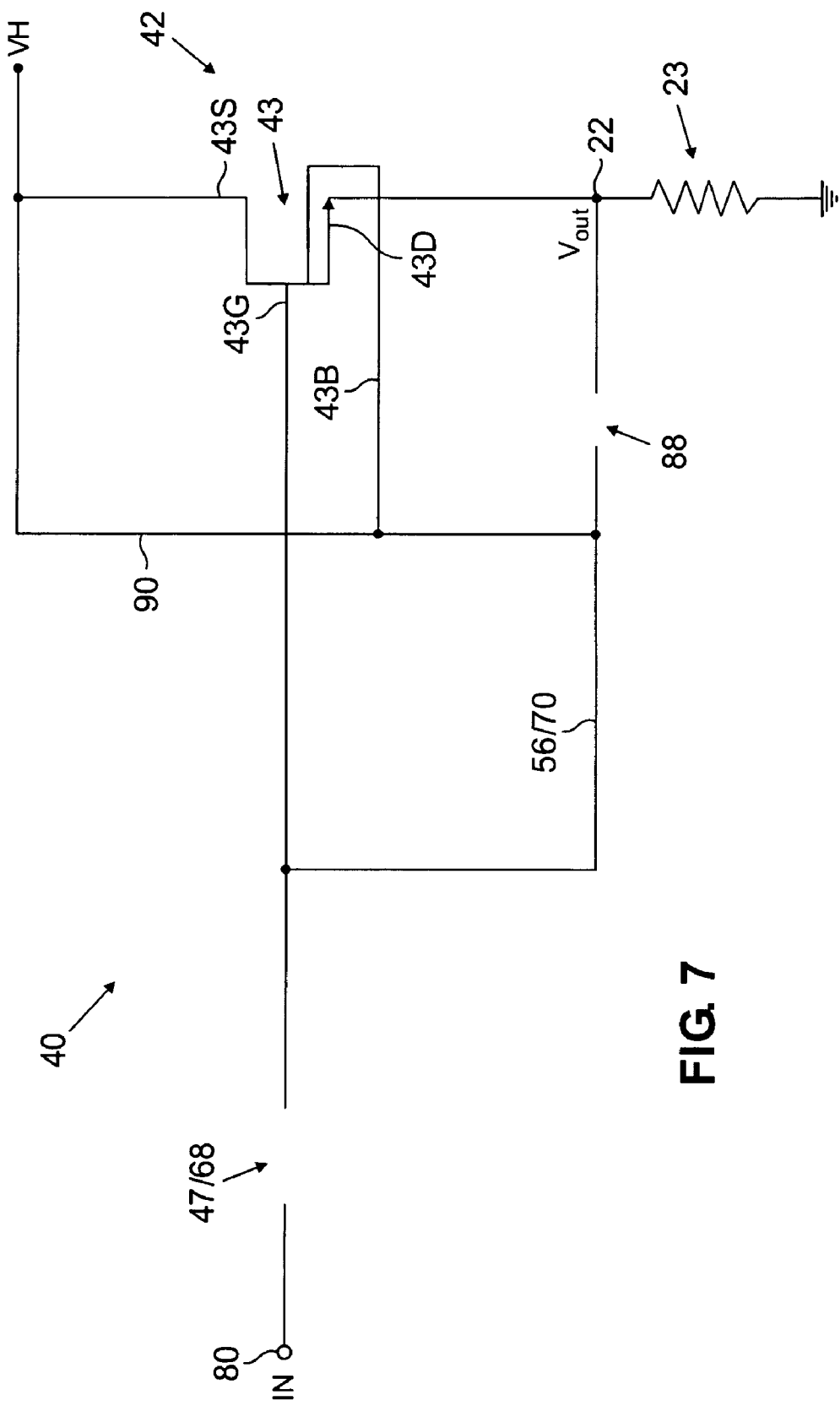

FIG. 7 is a schematic representation of this state of the breakdown protection circuit 40. Noting that the source and drain of a MOSFET are interchangeable, a terminal of the NFET 43 connected to the power supply VH is designated the source 43S and a terminal connected to the output terminal 22 is designated the drain 43D, which is a reversal of the terminal designations from FIGS. 5 and 6.

According to the prior art source follower, when the voltage at $V_{out}$ is greater than the voltage at the power supply VH (or greater than the VH+Vt), current can flow into the power supply via the forward biased body/drain pn junction of the source follower MOSFET, wherein the body (p-type) is connected to $V_{out}$ and the drain (n-type) is connected to the power supply. Also, with the source connected to $V_{out}$ and the gate connected to ground (since the MOSFET is off) the gate dielectric can breakdown due to excessive voltage (i.e., electric field intensity) between the source and ground through the gate dielectric.

According to the teachings of the present invention, these difficulties are avoided. Current cannot flow from $V_{out}$ to the power supply VH through the body/drain junction of the MOSFET 43 since the body or p-well 43B is not connected to the output terminal 22, but instead is connected to the power supply VH.

With regard to possible breakdown of the gate dielectric, as can be seen in FIG. 7, the gate 43G is tied to VH. Thus the voltage $V_{out}$ can increase to the sum of VH and the breakdown voltage of the gate dielectric, before dielectric breakdown. According to the prior art, $V_{out}$ is limited to the dielectric breakdown voltage because the gate is at ground potential. Thus the present invention provides additional margin with respect to limits on the voltage $V_{out}$ when the source follower is off.

Thus when the source follower 42 is off (whether the voltage at the output terminal 22 is less than the power supply voltage (VH−Vt), greater than (VH+Vt) or between (VH−Vt) and (VH+Vt), the gate 43G and the p-well 43B are shorted by PFET/NFET 56/70. The NFET 88 and the NFET 90 cooperate to short the gate 43G and the p-well 43B to whichever of the drain/source terminals 43D/43S is at a lower voltage. By definition, the terminal to which the p-well 43B and the gate 43G are shorted is the source of the NFET 43. Use of the source follower protection circuit 40 allows the net 31 to drive the voltage at the output terminal 22 above or below the voltage of the power supply VH without damaging the source follower 43, allowing use of source followers driven from different power supply voltages to drive the net without fear of source follower damage.

In the intermediate mode when the voltage $V_{out}$ is between (VH−Vt) and (VH+Vt) both of the MOSFETS 88 and 90 are off and the p-well 43B floats. If the p-well 43B floats to a voltage below (VH−Vt), the MOSFET 88 turns on, connecting the p-well 43B to the output terminal 22. The MOSFET 90 remains off. If the p-well 43B floats to a voltage above (VH+Vt), the MOSFET 90 turns on, connecting the p-well 43B to the power supply VH. The MOSFET 88 remains off.

The use of two parallel MOSFETS (such as the NFET/PFET 47/68 pair and the NFET/PFET 70/56 pair) are known in the art and commonly referred to as a pass gate or transfer gate. It is known that if only an NFET is employed to provide a closed path between its source and drain terminals, the NFET passes a signal having a voltage range from ground to (VH−Vt). If only a PFET is used, the PFET passes a signal having a voltage range from (ground+Vt) to the power supply voltage VH. Using both a PFET and an NFET allows a signal from ground potential to VH to pass through the parallel MOSFETS. Further with respect to the pass gates, according to the prior art it is known to connect the body of the PFET to the power supply and the body of the NFET to ground. However, this configuration is not necessarily required for the pass gates of the present invention; in other embodiments the bodies can be tied to other voltages.

Although the present invention is described as comprising enhancement mode MOSFETS for the pass gates, in another embodiment depletion mode MOSFETS can be utilized, with corresponding circuit modifications as understood by those skilled in the art. In yet another embodiment, the pass gates are replaced by a low threshold voltage MOSFET (e.g., having a threshold voltage of about 0.1 volts) permitting either a PFET or an NFET to pass a signal having a voltage extending nearly the entire range from ground to VH. In still another embodiment other types of electronic (e.g., junction field effect transistors), mechanical and nanotechnology devices can be used in place of the pass gate MOSFETs.

One application for the breakdown protection circuit 40 of the present invention comprises a hard disk drive of a computer or other data storage device. In certain disk drives a source follower drives a load operative with the read/write head for improving the data reading and data writing process. The protection circuit of the present invention is used advantageously with the source follower to protect against the conditions as described above, that are known to occur according to prior art source followers.

The breakdown protection circuit 40 can also be used in applications where the source follower power supply voltage is not fixed, but is variable as desired. Changing the power supply voltage changes the relationship between VH and Vout, possible leading to the damaging conditions described above. The source follower protection circuit 40 can protect the source follower against such conditions.

Figure 8:
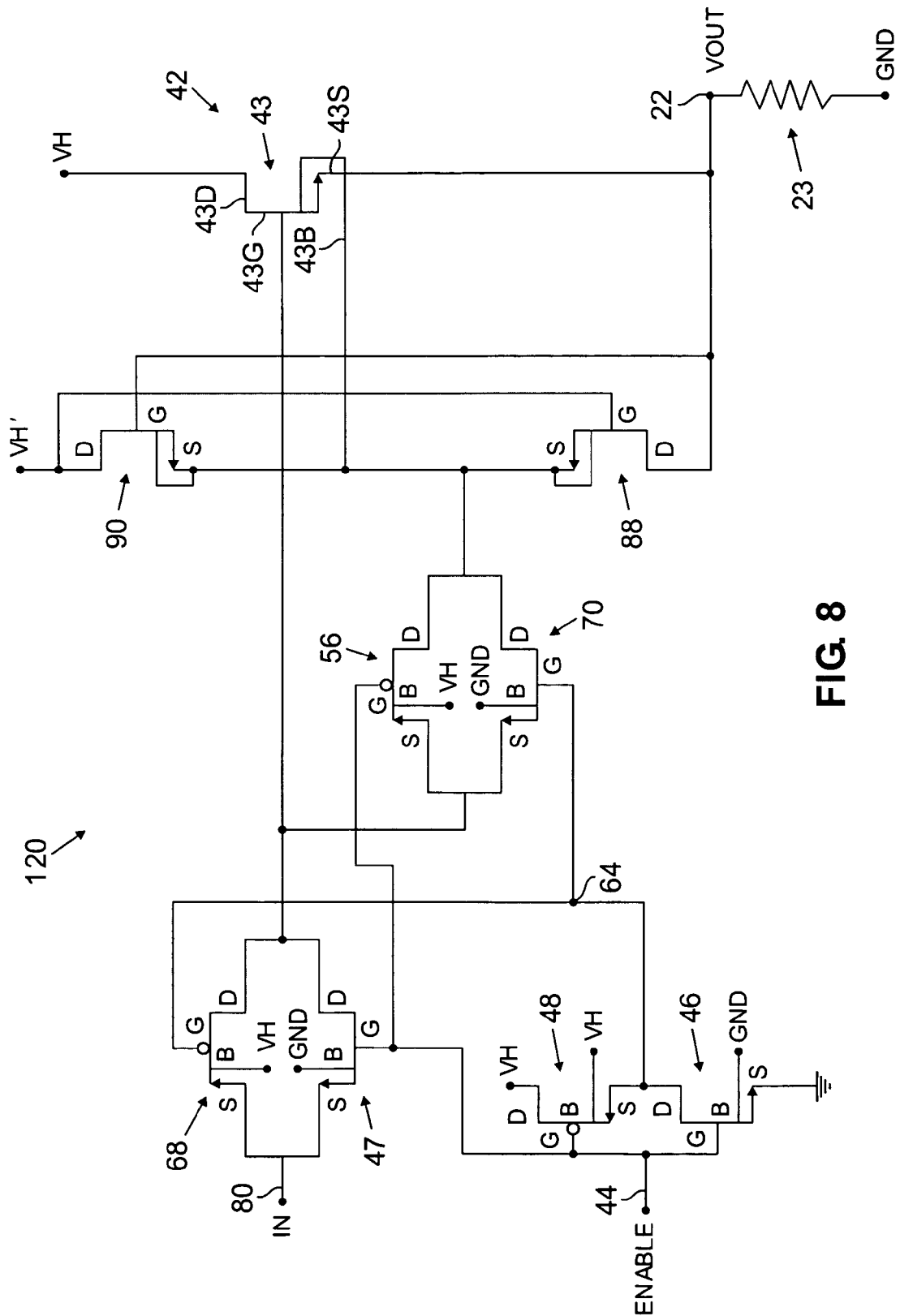
FIG. 8 is a schematic illustration of a second embodiment of a source follower breakdown protection circuit according to the teachings of the present invention.

In yet another embodiment, a source follower breakdown protection circuit 120 illustrated in FIG. 8 comprises a power supply voltage VH' connected to the drain D of the MOSFET 90 and to the gate G of the MOSFET 88. According to the embodiment of FIG. 4, the state of the MOSFETS 88 and 90 is determined by whether $V_{out}$ is less than (VH−Vt) or greater than (VH+Vt). According to the embodiment of FIG. 8, VH is replaced by VH', which can be less than or greater than VH. Thus the $V_{out}$ value at which the MOSFETS 88 and 90 change state is shifted by the difference between VH and VH'.

An architecture and process have been described as useful for a source follower breakdown protection circuit. Specific applications and exemplary embodiments of the invention have been illustrated and discussed, and provide a basis for practicing the invention in a variety of ways and with a variety of circuit structures. Numerous variations are possible within the scope of the invention. Features and elements associated with one or more of the described embodiments are not to be construed as required elements for all embodiments. The invention is limited only by the claims that follow.

What is claimed is:

1. A breakdown protection circuit for a field effect transistor comprising a gate responsive to an input signal supplied to an input terminal, a first source/drain responsive to a power supply voltage, a second source/drain for connecting to an output terminal and a body, the circuit comprising:
   a first switching element for selectably connecting the gate to the input terminal for operation in a source follower mode or to the body for turning the field effect transistor off; and
   a second switching element for selectably connecting the gate and body to the power supply when a voltage at the output terminal has a predetermined relation to the power supply voltage or to the output terminal for operation in the source follower mode.

2. The circuit of claim 1 wherein the predetermined relation is a voltage at the output terminal greater than a sum of the power supply voltage and a threshold voltage of the field effect transistor.

3. The circuit of claim 1 wherein for operation in a first off mode the first switching element connects the gate to the body and the second switching element connects the gate and body to the output terminal.

4. The circuit of claim 3 wherein the first off mode is responsive to a voltage at the output terminal less than a difference between the power supply voltage and a threshold voltage of the field effect transistor.

5. The circuit of claim 3 wherein for operation in a second off mode the first switching element connects the gate to the body and the second switching element connects the gate and body to the power supply.

6. The circuit of claim 5 wherein the second off mode is responsive to a voltage at the output terminal greater than a sum of the power supply voltage and a threshold voltage of the field effect transistor.

7. The circuit of claim 5 wherein the second switching element comprises a first switch connected between the body and the power supply and a second switch connected between the body and the output terminal, and wherein in the first off mode the first switch is in an open condition and the second switch is in a closed condition, and wherein in the second off mode the first switch is in a closed condition and the second switch is in an open condition.

8. The circuit of claim 1 wherein the output terminal is connected to ground via a resistive load.

9. The circuit of claim 1 wherein the first switching element comprises a first pass gate connected between the input terminal and the gate of the field effect transistor and a second pass gate connected between the gate of the field effect transistor and the body.

10. The circuit of claim 9 wherein in a source follower mode the first pass gate is in a closed state and the second pass gate is in an open state.

11. The circuit of claim 9 wherein in a first and a second off mode the first pass gate is in an open state and the second pass gate is in a closed state.

12. The circuit of claim 9 wherein the first and the second pass gates each comprise a parallel configuration of a PFET and an NFET, wherein a source of the PFET is connected to a source of the NFET and a drain of the PFET is connected to a drain of the NFET.

13. The circuit of claim 1 wherein at least one of the first switching element and the second switching element comprises a switching element exhibiting a series voltage drop of less than about 0.1 volts.

14. The circuit of claim 1 wherein the first switching element is selected from among an enhancement NMOSFET, a depletion NMOSFET, an enhancement PMOSFET and a depletion PMOSFET, each having a threshold voltage less than about 0.1 volts.

15. The circuit of claim 1 wherein the first switching element is controlled by an enable signal supplied to the breakdown protection circuit for causing the field effect transistor to operate in a source follower operational mode.

16. The circuit of claim 1 wherein the first source/drain comprises a region of a first conductivity type and the body comprises a region of a second conductivity type forming a pn junction between the body and the first source/drain, and wherein the second switching element selectably connects the gate and body to the power supply or to the output terminal to prevent forward biasing of the pn junction.

17. The circuit of claim 1 wherein the first source/drain comprises a region of a first conductivity type and the body comprises a region of a second conductivity type forming a pn junction between the body and the first source/drain, and wherein the second switching element connects the gate and body to the power supply in response to an output terminal voltage greater than a power supply voltage.

18. The circuit of claim 17 wherein the second switching element connects the gate and body to the power supply in response to the output terminal voltage greater than a sum of the power supply voltage and a transistor threshold voltage.

19. The circuit of claim 1 wherein the first source/drain comprises a region of a first conductivity type and the body comprises a region of a second conductivity type forming a pn junction between the body and the first source/drain, and wherein the second switching element connects the gate and body to a lower of the power supply voltage and an output terminal voltage.

20. The circuit of claim 19 wherein the second switching element connects the gate and body to the output terminal in response to the output voltage less than the power supply voltage less a transistor threshold voltage, and connects the gate and body to the power supply in response to the output voltage greater than the power supply voltage plus the transistor threshold voltage.

21. The circuit of claim 1 wherein the second switching element connects the gate body to one of the power supply and the output terminal in response to a lower of the power supply voltage and an output terminal voltage.

22. The circuit of claim 1 wherein a voltage at the output terminal can be driven above or below the power supply voltage without turning on the field effect transistor.

23. The circuit of claim 1 wherein the field effect transistor comprises a gate dielectric having a dielectric breakdown voltage, and wherein when the gate is connected to the body and the body is connected to the power supply, a voltage at the output terminal can increase to a sum of the power supply voltage and the gate dielectric breakdown voltage without causing breakdown of the gate dielectric.

* * * * *